US006999138B2

(12) United States Patent
Cok

(10) Patent No.: US 6,999,138 B2
(45) Date of Patent: Feb. 14, 2006

(54) TILED DISPLAY COMPRISING FACEPLATE AND DISPLAYS WITH AT LEAST ONE DEFECTIVE PIXEL AND METHOD OF MANUFACTURING SAID TILED DISPLAY

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 18 days.

(21) Appl. No.: 10/785,624

(22) Filed: Feb. 24, 2004

(65) Prior Publication Data

US 2005/0185114 A1 Aug. 25, 2005

(51) Int. Cl.
*G02F 1/133* (2006.01)
*G02B 6/08* (2006.01)

(52) U.S. Cl. ........................ 349/73; 349/159; 349/192; 345/1.3; 385/116; 385/120

(58) Field of Classification Search ................. 349/73, 349/159, 192; 385/116, 120, 121; 345/1.3
See application file for complete search history.

(56) References Cited

U.S. PATENT DOCUMENTS 4,299,447 A 11/1981 Soltan et al.
4,695,716 A 9/1987 Tandon et al.
4,874,227 A * 10/1989 Matsukawa et al. .......... 349/73
5,251,280 A * 10/1993 Asada et al. ................ 385/115
5,369,281 A 11/1994 Spinnler et al.
5,372,927 A 12/1994 Delton
5,465,315 A * 11/1995 Sakai et al. ................. 385/116
5,572,034 A * 11/1996 Karellas ..................... 250/368
5,654,781 A * 8/1997 Izumi ......................... 349/139
5,801,797 A 9/1998 Iida et al.
5,889,568 A * 3/1999 Seraphim et al. ............. 349/73
5,903,328 A 5/1999 Greene et al.
5,908,740 A 6/1999 Maskasky et al.
6,035,013 A 3/2000 Orava et al.
6,259,838 B1 * 7/2001 Singh et al. .................. 385/31
6,262,696 B1 7/2001 Seraphim et al.
6,370,019 B1 4/2002 Matthies et al.
6,385,430 B1 5/2002 Jackson et al.

(Continued)

FOREIGN PATENT DOCUMENTS

EP 0 179 913 5/1986

(Continued)

*Primary Examiner*—Andrew Schechter
(74) *Attorney, Agent, or Firm*—Andrew J. Anderson

(57) ABSTRACT

A method of manufacturing a tiled display is disclosed comprising the steps of: a) selecting a plurality of flat-panel displays, each flat-panel display having a display area comprising a plurality of pixels arranged in an array and having at least one defective pixel; and b) forming a tiled display by locating one or more faceplates in alignment with the plurality of flat-panel displays, the one or more faceplates having a plurality of lightpipes in an array, the lightpipes having input and output end faces for transmitting light from the display areas of the flat-panel displays to a display surface of the tiled display, wherein the input end face of each of the lightpipes has an area larger than the area of one pixel of the selected flat-panel displays, and wherein each lightpipe transmits light from more than one pixel from the display area of the flat-panel displays to the display surface of the tiled display. Also described are tiled display made according to the method.

32 Claims, 4 Drawing Sheets

U.S. PATENT DOCUMENTS

| | | | | |
|---|---|---|---|---|
| 6,479,827 | B1 | 11/2002 | Hamamoto et al. | |
| 6,498,592 | B1 | 12/2002 | Matthies | |
| 6,559,910 | B1 | 5/2003 | Suzuki et al. | |
| 6,618,115 | B1 * | 9/2003 | Hiroki | 349/192 |
| 2002/0018151 | A1 | 2/2002 | Suzuki et al. | |
| 2003/0234343 | A1 | 12/2003 | Cok et al. | |
| 2004/0001679 | A1 * | 1/2004 | Sisodia et al. | 385/120 |

FOREIGN PATENT DOCUMENTS

| | | |
|---|---|---|
| EP | 0 485 235 | 5/1992 |
| EP | 0 491 662 | 6/1992 |
| EP | 1 389 740 | 2/2004 |
| JP | 63/142330 | 6/1988 |
| JP | 2003-332633 | 11/2003 |
| WO | 99/41732 | 8/1999 |

* cited by examiner

TILED DISPLAY COMPRISING FACEPLATE AND DISPLAYS WITH AT LEAST ONE DEFECTIVE PIXEL AND METHOD OF MANUFACTURING SAID TILED DISPLAY

FIELD OF THE INVENTION

This invention relates generally to a method for manufacturing a tiled display, in particular to a method for manufacturing a tiled display using an optical faceplate.

BACKGROUND OF THE INVENTION

It is known to increase the size of an electro-optic imaging device such as a flat panel display or an image sensor by forming the device using a plurality of tiles, each tile having a two-dimensional array of pixels, see for example U.S. Pat. No. 6,262,696 issued Jul. 17, 2001 to Seraphim et al. Large tiled displays can also be made using an array of fiber optic panels in association with smaller displays. The fiber optic panels reduce the edge gap between the display tiles as described in U.S. Pat. No. 4,299,447 issued Nov. 10, 1981 to Soltan et al. WO 99/41732, Matthies et al., published Aug. 19, 1999, describes forming a tiled display device from display tiles having pixel positions defined up to the edge of the tiles. One example of the use of tiles to increase the size of an image sensor is shown in U.S. Pat. No. 5,572,034, issued Nov. 5, 1996 to Karellas.

However, construction of tiled imaging devices is difficult. No two tiles, whether used alone or with fiber optic faceplates, are precisely alike and the human eye is extremely sensitive to differences in color, brightness, and contrast in localized areas. There are calibration techniques by which the uniformity and color balance of a display or image sensor tile can be adjusted, but these are difficult, require re-adjustment over time, and are often inadequate. Moreover, the seams between the tile edges are very noticeable as the human eye is very sensitive to straight horizontal and vertical lines.

The assembly of flat-panel tiles is also a problem. In order to ameliorate the problems associated with tile seams, the tiled displays must be assembled very carefully and with great precision. This process is expensive and slow and products are prone to fall out of alignment over time without expensive forms or brackets to align the tiles once they are placed.

Moreover, the use of multiple display devices raises the cost of the larger display significantly. It can be true that single-substrate display devices are less expensive than tiled displays of a comparable size.

There is a need therefore for a method for manufacturing a tiled electro-optic display device that reduces the costs of a tiled display device while reducing the visibility of tile non-uniformities and tile seams, and that enhances the mechanical assembly of the tiles.

SUMMARY OF THE INVENTION

In accordance with one embodiment, the present invention is directed towards a method of manufacturing a tiled display comprising the steps of: a) selecting a plurality of flat-panel displays, each flat-panel display having a display area comprising a plurality of pixels arranged in an array and having at least one defective pixel; and b) forming a tiled display by locating one or more faceplates in alignment with the plurality of flat-panel displays, the one or more faceplates having a plurality of lightpipes in an array, the lightpipes having input and output end faces for transmitting light from the display areas of the flat-panel displays to a display surface of the tiled display, wherein the input end face of each of the lightpipes has an area larger than the area of one pixel of the selected flat-panel displays, and wherein each lightpipe transmits light from more than one pixel from the display area of the flat-panel displays to the display surface of the tiled display.

In accordance with a second embodiment, the present invention is directed towards a tiled display comprising: a) a plurality of flat-panel displays, each flat-panel display having a display area comprising a plurality of pixels arranged in an array and having at least one defective pixel; and b) one or more faceplates located in alignment with the plurality of flat-panel displays, the one or more faceplates having a plurality of lightpipes in an array, the lightpipes having input and output end faces for transmitting light from the display areas of the flat-panel displays having a first size to display surface of the tiled display having a larger size parallel to the display areas of the flat-panel displays, wherein the input end face of each of the lightpipes has an area larger than the area of one pixel of the selected flat-panel displays, and wherein each lightpipe transmits light from more than one pixel from the display area of the flat-panel displays to the display surface of the tiled display.

ADVANTAGES

The present invention has the advantage of providing a tiled flat-panel array at reduced costs and improved performance.

It will be understood that the figures are not to scale since the pixel elements are much smaller than the display device.

DETAILED DESCRIPTION OF THE INVENTION

Figure 1:
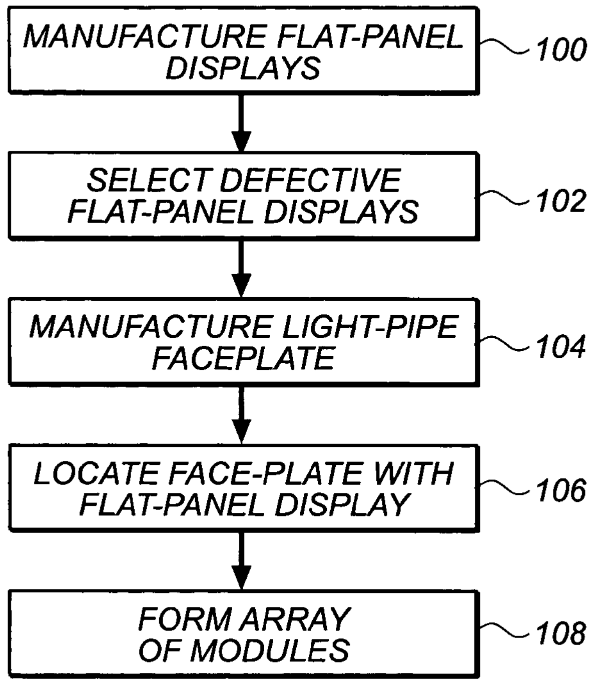
FIG. 1 is a flow diagram illustrating one embodiment of the method of the present invention.

Referring to FIG. 1, a method of manufacturing a tiled display system in accordance with one embodiment of the invention comprises manufacturing 100 a plurality of flat-panel displays, each flat-panel display having a display area comprising a plurality of pixels arranged in an array; selecting 102 flat-panel displays having at least one defective pixel; manufacturing 104 a faceplate having a plurality of lightpipes in an array, the lightpipes having input and output end faces for transmitting light from the display areas of the flat-panel displays to a display surface of the tiled display, wherein the input end face of each of the lightpipes has an area larger than the area of one pixel; and locating 106 one or more faceplates in alignment with the plurality of flat-panel displays to 108 form a tiled display, wherein each lightpipe of the one or more faceplates transmits light from more than one pixel from the display area of the flat-panel displays to the display surface of the tiled display. In preferred embodiments, the display areas of the flat-panel displays have a first size, and the lightpipes transmit light from the display areas to a display surface of the tiled display having a second size larger than that of the display areas of the flat-panel displays. Further, the display surface of the tiled display is preferably parallel to the display areas of the flat-panel displays. The tiled display may be formed by locating individual faceplates in alignment with each selected flat-panel display, and aligning adjacent edges of the individual faceplates in an array. Alternatively, the tiled display may be formed by locating multiple selected flat-panel displays in alignment with a single faceplate. In such alternative embodiment, single faceplates aligned with multiple selected flat-panel displays may themselves also be aligned in an array.

The method of the present invention reduces costs by selecting flat-panel displays that are normally unacceptable for use as individual disp conventional application, for example monitors or video devices. To construct a tiled display device according to the present invention, flat-panel displays having a plurality of pixels are first manufactured. It is well known that such manufacturing processes are imperfect and yield a number of flat-panel displays with defective pixels. These pixels may be defective in color, dynamic range, or may be stuck on or off. Depending on the intended application, a certain number of bad pixels may be acceptable. Those displays whose quality is unacceptable are wasted. According to the present invention, displays having at least one defective pixel are selected. Because the display system of the present invention utilizes displays that are normally rejected, the costs of the larger display are greatly reduced.

Faceplates having a plurality of lightpipes are formed in an array complementary to the pixel array of the flat-panel displays, but at a lower resolution (i.e., each lightpipe transmits light from more than one pixel). In one embodiment, each faceplate is aligned with one of the selected flat-panel displays and held in place, for example through adhesives or fasteners in a frame. Alternatively, multiple selected flat-panel displays may be located in alignment with a single faceplate. Electronic components (e.g. printed circuit boards with circuitry) or connectors may also be fastened to the display. The faceplates may then be located edge-to-edge to form a larger array. The faceplates may have inter-digitated edges to aid alignment.

The pixels of one or more of the lightpipes of the flat-panel displays are defective. As each lightpipe transmits light from more than one pixel, the light from any defective pixel will be averaged with neighboring good pixels to reduce effect of the defective pixel. If each lightpipe covers a sufficiently large number of pixels, it is possible that no software correction will be necessary to accommodate the one or more defective pixels. The defective elements may not be perceptible when combined with a larger number of good pixels. For example, if a lightpipe has a 10-by-10 array of pixels (100 in total), the presence of a bad pixel within the 100 pixels may not be noticeable. In this case, no correction need be made.

However, if the defective pixels are noticeable, compensation may be provided in a variety of ways. If a pixel is stuck off, the other pixels using the same lightpipe may be made brighter. This effectively reduces the lifetime of the display. Alternatively, a reduced brightness may be acceptable if the uniformity of the display is maintained by likewise reducing the brightness of the other pixels to a common brightness. If a pixel is stuck on, a similar correction may be made by turning on a pixel in every lightpipe (reducing the overall contrast of the display), or the other pixels using the same lightpipe may be made dimmer. If color elements are inoperative, color corrections can also be made either within the pixels associated with a single lightpipe or by correcting the light output of the other lightpipes.

The corrections may be calculated by measuring the light output of the display with, for example, a digital camera. The uniformity, dynamic range, black level, white level, and color may be measured by displaying a variety of test images on the display. If any corrections for pixels are necessary to maintain the quality of the display, they may be calculated and implemented in the electronics, typically through lookup tables, amplifiers, and the like.

Figure 2:
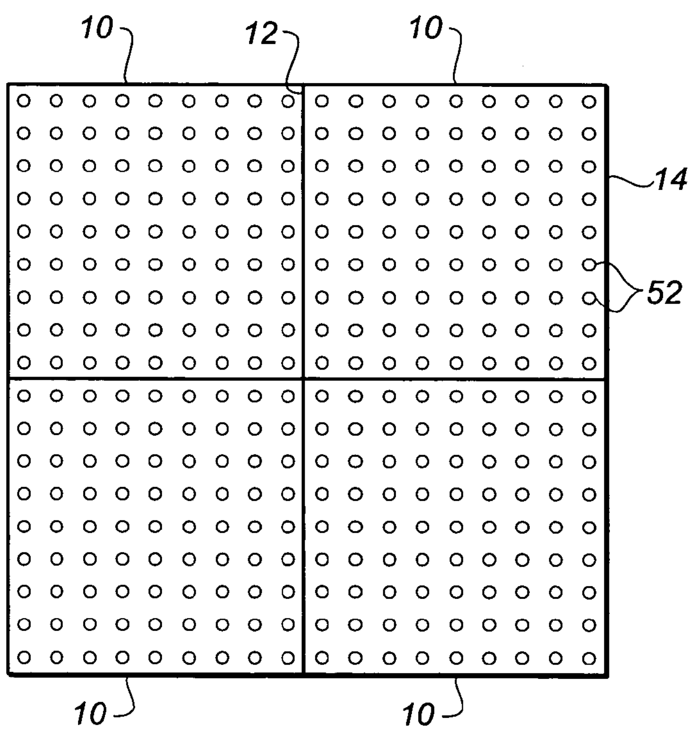
FIG. 2 is a schematic diagram of a prior art tiled display having a two-by-two array of tiles.

Referring to FIG. 2, a tiled display in accordance with one possible embodiment of the invention includes a two-by-two array of tiles 10, having edges 14 and an array of pixel groups. Light from each pixel group is transmitted through a single lightpipe 52. The edges 14 of the tiles 10 are aligned to produce a seam 12 between the edges of the tiles 14 and the last row or column of lightpipes 52 in the arrays. (The illustration of FIG. 2 is not drawn to scale to clarify the description). While the arrangement of FIG. 2 advantageously has a simple structure, the edge seam 12 may be visible to the human eye because it is straight, is horizontal or vertical, and has a direction that is the same as the pixel rows and columns. Moreover, small differences between the tiles, for example color, brightness, sensitivity or noise may be visible to the human eye.

Figure 3A:
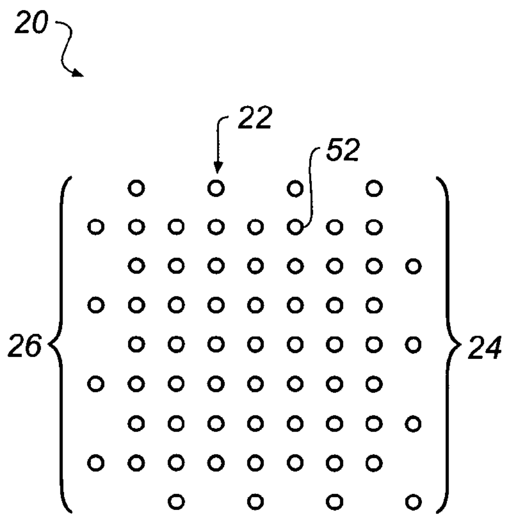
FIG. 3*a* is a schematic diagram of an inter-digitated pixel layout for a tile according to one embodiment of the present invention.
Figure 3B:
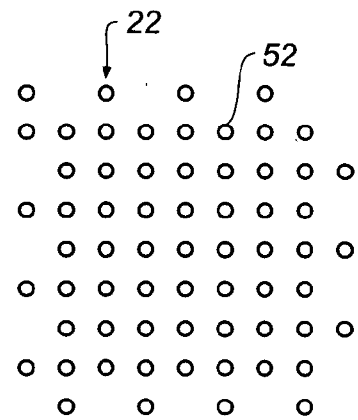
FIG. 3*b* is a schematic diagram of an inter-digitated pixel layout for a tile according to another embodiment of the present invention.
Figure 4:
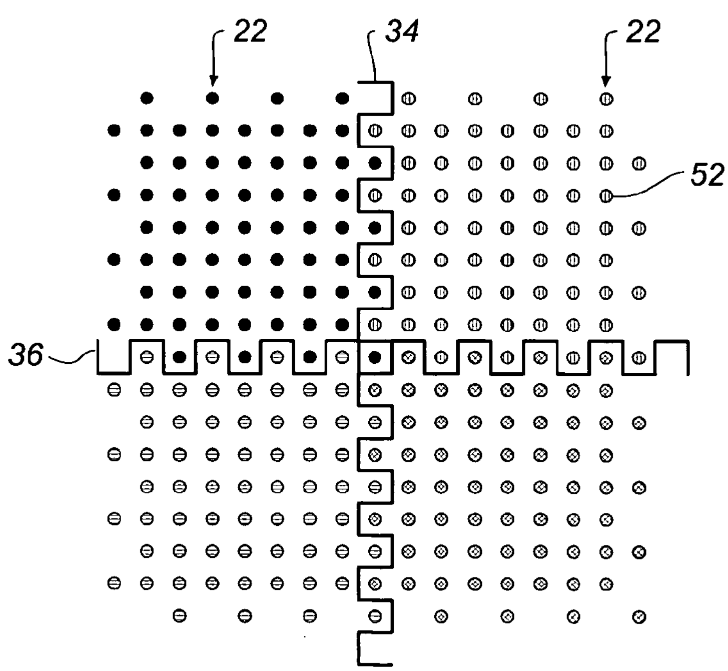
FIG. 4 is a schematic diagram of a two-by-two array of inter-digitated tiles according to an embodiment of the present invention using the pixel layout of FIG. 3*a;*

Referring to FIGS. 3*a* and 3*b*, two tiles having edge structures according to two preferred embodiments of the method of the present invention is shown. In FIGS. 3*a* and 3*b*, the four edges of tile 10 are non-linear and the rows and columns of lightpipes have a stepped pattern such that each row or column 22 extends beyond the adjacent row or column on alternating ends to form an inter-digitated array 20 of lightpipes. Moreover, the rows and columns on the opposing edges 24 and 26 of each tile have a complementary form such that the rows and columns on each tile edge can be inter-digitated as shown in FIG. 4. Referring to FIG. 4, four of the tiles 10 are arranged to form a regular array of lightpipes 52 with the result that lightpipes at the edges of the tiles are inter-digitated to form an inter-digitated column 34 or row 36. This inter-digitation of the lightpipes at the tile edges has multiple benefits. First, the tile seam is less visible to the human eye because it is not straight, thus reducing the visibility of tile seams. Second, the inter-digitation of lightpipes from two adjacent tiles obscures differences in uniformity between the tiles. Third, the edges of the tiles can no longer slip with respect to each other because the stepped shape of the edge locks the tiles in position with respect to each other. Moreover, the tiles are easier to assemble since they lock into a specific location with respect to each other.

Note that although the illustration of FIGS. 3 and 4 show inter-digitation in two dimensions, it is also possible to inter-digitate in only one dimension, for example by rows only or by columns only. This approach provides alignment and visibility improvements in only one dimension but is significantly easier to manufacture.

Applicants have conducted tests with human subjects simulating a tiled display device according to the present invention, on a CRT display that have shown that an inter-digitated edge between tiles increases by as much as fifty percent the threshold at which a global uniformity difference between the tiles is perceptible and reduces the visibility of an edge seam by as much as 50%.

Each tile in a multi-tile device according to the present invention may have a complementary pattern on opposite edges 24 and 26 so that the tiles can be placed together with inter-digitated lightpipes along the edges. Tiles on the edges of a multi-tile device will not have a straight edge. The edges of the tiled array can be masked with a frame to obscure the non-linear external edges. Alternatively, special edge and corner tiles may be created with one or more conventional straight edges.

The pixel control mechanisms for the tiles need not be modified and the row and column controls normally present in a device may operate normally. In a display device, each tile's information overlaps with the neighboring tiles so that neighboring tiles will have edge rows and edge columns of information in common. Referring to FIGS. 3 and 4, adjacent tiles overlap by one column or row 22 of pixel groups. This reduces the total number of rows and columns in the entire display by the total overlap amount.

Figure 5:
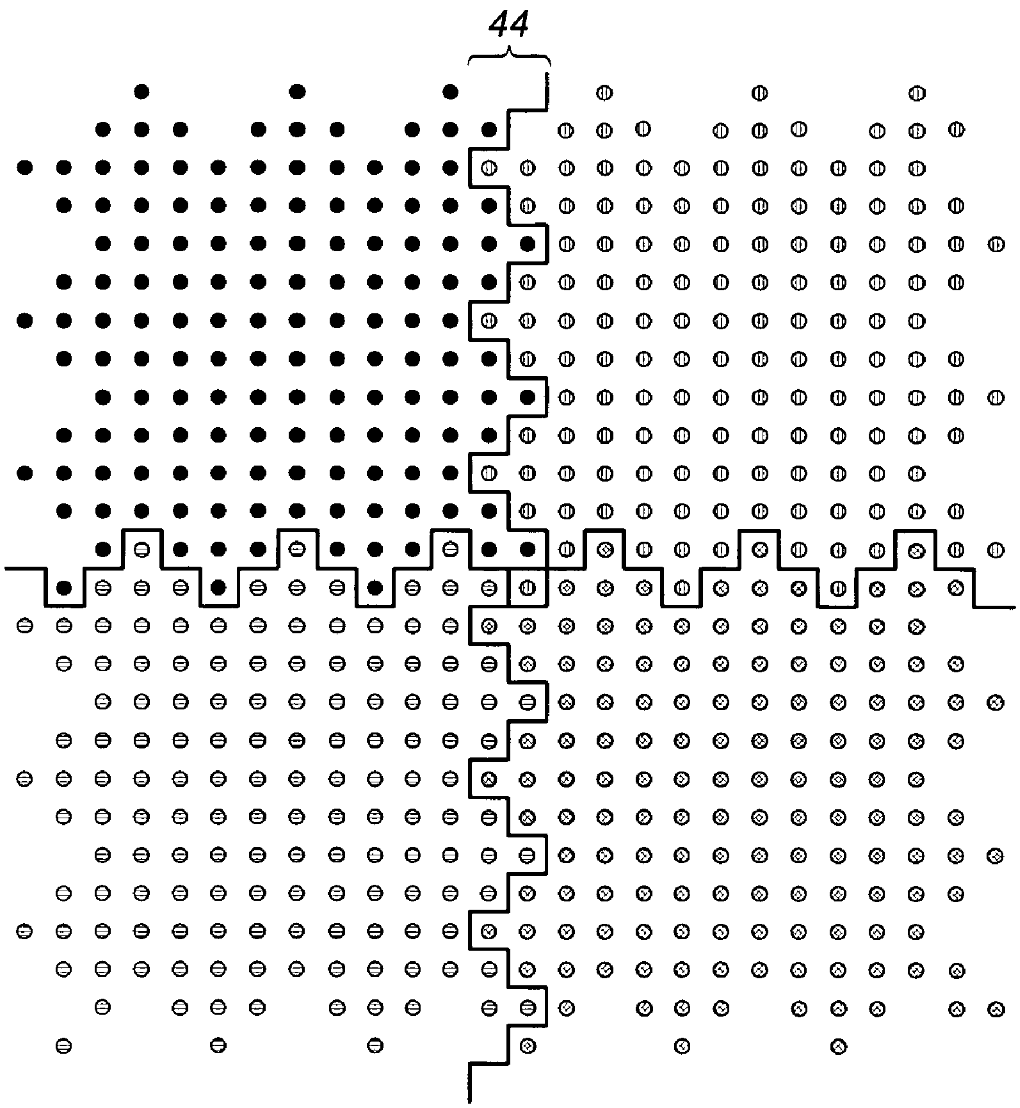
FIG. 5 is a schematic diagram of a two-by-two array of inter-digitated tiles having an alternative inter-digitation according to an embodiment of the present invention.

A variety of tile edge shapes may be used. Deeper stair steps that are multiple pixels deep may be used, as shown in FIG. 5. Referring to FIG. 5, the tiles incorporate a stair-step edge that overlaps by two columns or rows 44 of pixel groups. The process may be extended to larger overlaps with improved seam hiding and apparent tile uniformity but at the cost of more overlapped rows or columns.

Figure 6:
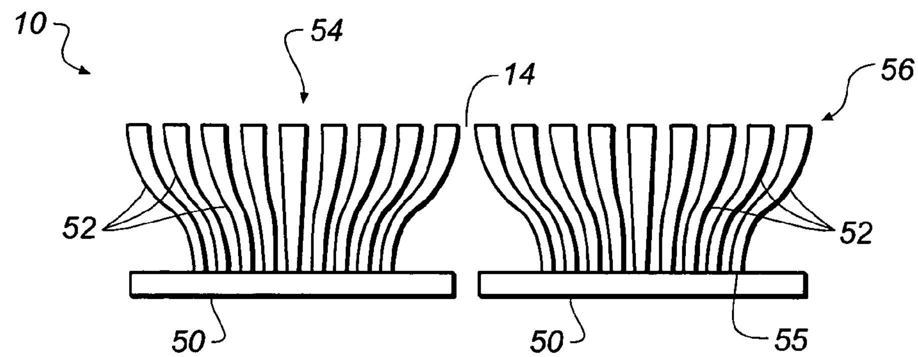
FIG. 6 is a side view of two aligned tile modules with faceplates and substrates according to an embodiment of the present invention.

Referring to FIG. 6, the tiles 10 include a flat-panel display 50 with a faceplate 54 comprising an array of lightpipes 52. Suitable flat-panel displays may be, for example, liquid crystal displays, organic light emitting diode displays, or plasma displays. The faceplates 54 have edges 14 that serve to align one faceplate 54 with another. Each faceplate 54 has two faces, an input face 55 and an output face 56. The lightpipes 52 have an input side 55 located in close proximity to the flat-panel display 50 that conducts light from the pixels with which the lightpipes are aligned through the body of the lightpipes to the output side 56 from which light is emitted to a viewer. In accordance with preferred embodiments, the output side 56 of the faceplate 54 is larger than the input side 55, to accommodate non-light emitting areas on the peripheries of individual flat-panel displays 50. In such embodiment, each individual lightpipe must either be separated by a greater distance on the output side 56 than the input side 55 or must be larger on the output side 56 than on the input side 55. This allows the faceplates 54 to be aligned along the output sides 56 while providing space for a flat-panel display 50 to be located in alignment on the input side 55.

Figure 7A:
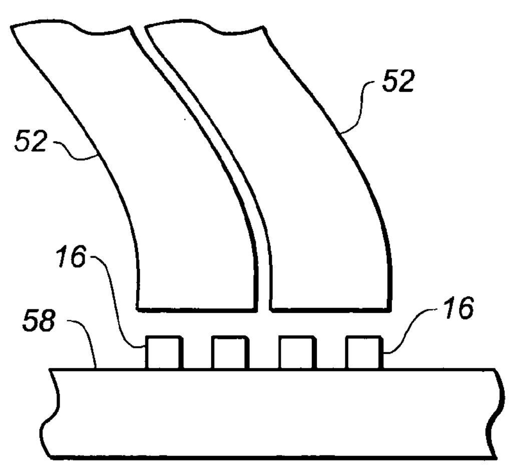
FIG. 7*a* is a side view of a two-by-two array of lightpipes aligned with pixels on a substrate according to an embodiment of the present invention.
Figure 7B:
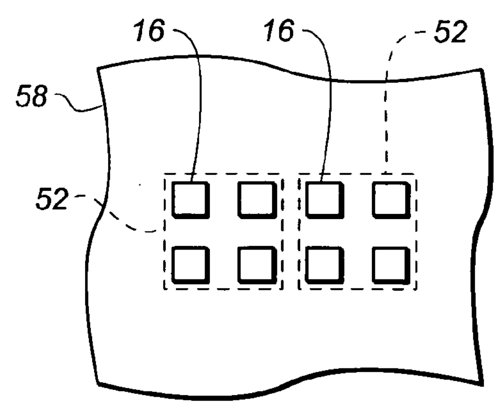
FIG. 7*b* is a top view of the two-by-two array of lightpipes aligned with pixels on a substrate as shown in FIG. 7*a* according to an embodiment of the present invention.

Referring to FIGS. 7*a* and 7*b*, a partial cross-section (FIG. 7*a*) and top view (FIG. 7*b*) of two lightpipes 52 and their associated light-emitting pixels 16 are shown. The pixels 16 are formed on a substrate 58 and may include multiple sub-elements each emitting a different color to form a single, color pixel. Each lightpipe transmits the light from more than one pixel. In the example shown in FIGS. 7*a* and 7*b*, each lightpipe is associated with four pixels arranged in a two-by-two array. In practice, the number of pixels associated with each lightpipe will vary depending on the desired resolution of the overall display, the resolution of the individual displays used in each tile, and the number of lightpipes in the overall display.

Because each lightpipe transmits light from more than one pixel, the effective resolution of each tile is reduced. In practice, electronic devices capable of transforming a conventional video or other signal (for example, an HDTV or DVI signal) convert the input signal into a set of signals, each associated with one display tile. The converted signal is at a reduced resolution and transmits a single pixel element signal to all of the pixels associated with each lightpipe. Such electronic processing equipment is described, for example, in US2004/0008155A.

The invention has been described in detail with particular references to certain preferred embodiments thereof, but it will be understood that variations and modification can be effected within the spirit and scope of the invention.

PARTS LIST

8 electro-optic imaging device
10 tile
12 seam
14 edge
16 pixels
20 inter-digitated array of lightpipes
22 row or column of lightpipes
24 tile edge
26 tile edge
34 inter-digitated column
36 inter-digitated row
44 interdigitated multiple columns or rows
50 flat-panel display
52 lightpipe
54 faceplate
55 input face
56 output face
58 substrate
100 manufacture flat-panel display step
102 select step
104 manufacture light-pipe faceplate step
106 locate step
108 form step

What is claimed is:

1. A method of manufacturing a tiled display comprising the steps of:

a) selecting a plurality of flat-panel displays, each flat-panel display having a display area comprising a plurality of pixels arranged in an array and having at least one defective pixel;

b) forming a tiled display by locating one or more faceplates in alignment with the plurality of flat-panel displays, the one or more faceplates having a plurality of lightpipes in an array, the lightpipes having input and output end faces for transmitting light from the display areas of the flat-panel displays to a display surface of the tiled display, wherein the input end face of each of the lightpipes has an area larger than the area of one pixel of the selected flat-panel displays, and wherein each lightpipe transmits light from more than one pixel from the display area of the flat-panel displays to the display surface of the tiled display.

2. The method claimed in claim 1, wherein the display areas of the flat-panel displays have a first size, and wherein the lightpipes transmit light from the display areas to a display surface of the tiled display having a second size larger than that of the display areas of the flat-panel displays.

3. The method claimed in claim 2, wherein the display surface of the tiled display is parallel to the display areas of the flat-panel displays.

4. The method claimed in claim 1, wherein the tiled display is formed by locating individual faceplates in alignment with each selected flat-panel display, and aligning adjacent edges of the individual faceplates in an array.

5. The method claimed in claim 4 wherein aligned adjacent edges of the faceplates are inter-digitated in at least one dimension.

6. The method claimed in claim 5 wherein the aligned adjacent edges of the faceplates are inter-digitated in two dimensions.

7. The method claimed in claim 5 wherein the aligned adjacent edges of the faceplates are inter-digitated in at least one dimension by more than one row or column.

8. The method claimed in claim 1, wherein the tiled display is formed by locating multiple selected flat-panel displays in alignment with a single faceplate.

9. The method claimed in claim 8, wherein lightpipes transmitting light from pixel elements along adjacent edges of the flat panel displays are inter-digitated at the display surface of the tiled display in at least one dimension.

10. The method claimed in claim 9 wherein the lightpipes transmitting light from pixel elements along adjacent edges of the flat panel displays are inter-digitated at the display surface of the tiled display in two dimensions.

11. The method claimed in claim 9 wherein lightpipes transmitting light from pixel elements along adjacent edges of the flat panel displays are inter-digitated at the display surface of the tiled display in at least one dimension by more than one row or column.

12. The method claimed in claim 1 wherein the defective pixels are defective in color and/or brightness.

13. The method claimed in claim 1 further including the step of providing a controller for correcting the light output of each lightpipe to a common brightness, color, and dynamic range.

14. The method claimed in claim 1 wherein the flat-panel displays are liquid crystal displays.

15. The method claimed in claim 1 wherein the flat-panel displays are organic light emitting diode displays.

16. The method claimed in claim 1 wherein the flat-panel displays are plasma displays.

17. A tiled display comprising:

a) a plurality of flat-panel displays, each flat-panel display having a display area comprising a plurality of pixels arranged in an array and having at least one defective pixel; and b) one or more faceplates located in alignment with the plurality of flat-panel displays, the one or more faceplates having a plurality of lightpipes in an array, the lightpipes having input and output end faces for transmitting light from the display areas of the flat-panel displays to a display surface of the tiled display, wherein the input end face of each of the lightpipes has an area larger than the area of one pixel of the selected flat-panel displays, and wherein each lightpipe transmits light from more than one pixel from the display area of the flat-panel displays to the display surface of the tiled display.

18. The tiled display claimed in claim 17, wherein the display areas of the flat-panel displays have a first size, and wherein the lightpipes transmit light from the display areas to a display surface of the tiled display having a second size larger than that of the display areas of the flat-panel displays.

19. The tiled display claimed in claim 18, wherein the display surface of the tiled display is parallel to the display areas of the flat-panel displays.

20. The tiled display claimed in claim 17, having individual faceplates in alignment with each selected flat-panel display, wherein adjacent edges of the individual faceplates are aligned in an array.

21. The tiled display claimed in claim 20 wherein aligned adjacent edges of the faceplates are inter-digitated in at least one dimension.

22. The tiled display claimed in claim 21 wherein the aligned adjacent edges of the faceplates are inter-digitated in two dimensions.

23. The tiled display claimed in claim 21 wherein the aligned adjacent edges of the faceplates are inter-digitated in at least one dimension by more than one row or column.

24. The tiled display claimed in claim 17, having multiple selected flat-panel displays in alignment with a single face plate.

25. The tiled display claimed in claim 24, wherein lightpipes transmitting light from pixel elements along adjacent edges of the flat panel displays are inter-digitated at the display surface of the tiled display in at least one dimension.

26. The tiled display claimed in claim 25 wherein the lightpipes transmitting light from pixel elements along adjacent edges of the flat panel displays are inter-digitated at the display surface of the tiled display in two dimensions.

27. The tiled display claimed in claim 24 wherein lightpipes transmitting light from pixel elements along adjacent edges of the flat panel displays are inter-digitated at the display surface of the tiled display in at least one dimension by more than one row or column.

28. The tiled display claimed in claim 17 wherein the defective pixels are defective in color and/or brightness.

29. The tiled display claimed in claim 17 further including a controller for correcting the light output of each lightpipe to a common brightness, color, and dynamic range.

30. The tiled display claimed in claim 17 wherein the flat-panel displays are liquid crystal displays.

31. The tiled display claimed in claim 17 wherein the flat-panel displays are organic light emitting diode displays.

32. The tiled display claimed in claim 17 wherein the flat-panel displays are plasma displays.

* * * * *